(12) United States Patent
Petz et al.

(10) Patent No.: US 11,133,461 B2
(45) Date of Patent: Sep. 28, 2021

(54) LAMINATE DIFFUSION BARRIERS AND RELATED DEVICES AND METHODS

(71) Applicant: Intel Corporation, Santa Clara, CA (US)

(72) Inventors: Christopher Petz, Boise, ID (US); Dale Collins, Boise, ID (US); Tsz-Wah Chan, Boise, ID (US); Swapnil Lengade, Boise, ID (US); Yongjun Hu, Boise, ID (US); Allen McTeer, Eagle, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/497,801

(22) Filed: Sep. 26, 2014

(65) Prior Publication Data

US 2016/0093804 A1 Mar. 31, 2016

(51) Int. Cl.
*H01L 45/00* (2006.01)
*H01L 21/768* (2006.01)
*H01L 27/24* (2006.01)

(52) U.S. Cl.
CPC .... *H01L 45/1253* (2013.01); *H01L 21/76846* (2013.01); *H01L 27/2427* (2013.01); *H01L 27/2463* (2013.01); *H01L 45/04* (2013.01); *H01L 45/06* (2013.01); *H01L 45/12* (2013.01); *H01L 45/16* (2013.01); *H01L 45/1608* (2013.01)

(58) Field of Classification Search
CPC . H01L 45/1253; H01L 45/06; H01L 45/1608; H01L 21/76841; H01L 21/02172; H01L 21/02186; H01L 21/02697; H01L 27/2463; H01L 27/2481; H01L 45/1206
See application file for complete search history.

(56) References Cited

U.S. PATENT DOCUMENTS

| | | | | |
|---|---|---|---|---|
| 4,823,182 A | * | 4/1989 | Okumura | H01L 21/76843 257/751 |
| 5,359,205 A | * | 10/1994 | Ovshinsky | G11C 11/56 257/3 |
| 5,406,509 A | * | 4/1995 | Ovshinsky | G11C 11/56 257/3 |
| 5,536,947 A | * | 7/1996 | Klersy | G11C 11/56 257/3 |

(Continued)

FOREIGN PATENT DOCUMENTS

| JP | S63131572 A | 6/1988 |
|---|---|---|
| JP | 2765884 B2 * | 6/1998 |

(Continued)

OTHER PUBLICATIONS

Quirk & Serda "Semiconductor Manufacturing Technology" pp. 307-308. Published by Prentice Hall in 2001 (Year: 2001).*

(Continued)

*Primary Examiner* — Tuan A Hoang
(74) *Attorney, Agent, or Firm* — Alliance IP, LLC

(57) ABSTRACT

Devices and systems having a diffusion barrier for limiting diffusion of a phase change material including an electrode, a phase change material electrically coupled to the electrode, and a carbon and TiN (C:TiN) diffusion barrier disposed between the electrode and the phase change material to limit diffusion of the phase change material are disclosed and described.

11 Claims, 4 Drawing Sheets

(56) References Cited

U.S. PATENT DOCUMENTS

| | | | |
|---|---|---|---|
| 6,081,034 A | 6/2000 | Sandhu et al. | |
| 6,136,682 A * | 10/2000 | Hegde | H01L 21/76807 204/192.15 |
| 7,470,934 B2 | 12/2008 | Linder | |
| 7,923,839 B2 * | 4/2011 | Kitamura | H01L 21/76843 257/751 |
| 8,030,734 B2 * | 10/2011 | Dennison | H01L 45/1683 257/529 |
| 2004/0126957 A1 * | 7/2004 | Sezi | H01L 21/312 438/216 |
| 2006/0148248 A1 * | 7/2006 | Brooks | H01L 21/76877 438/654 |
| 2007/0075427 A1 * | 4/2007 | Lavoie | H01L 21/28562 257/750 |
| 2010/0176365 A1 * | 7/2010 | Park | H01L 27/2409 257/3 |
| 2011/0095258 A1 | 4/2011 | Xu et al. | |
| 2012/0161094 A1 * | 6/2012 | Huo | H01L 27/249 257/4 |
| 2012/0225534 A1 * | 9/2012 | Lee | H01L 45/06 438/382 |
| 2013/0126510 A1 | 5/2013 | Oh et al. | |
| 2014/0048859 A1 * | 2/2014 | Nakano | H01L 29/4975 257/296 |

FOREIGN PATENT DOCUMENTS

| | | | | |
|---|---|---|---|---|
| JP | H11-510317 A | 9/1999 | | |
| JP | 2007013164 A | 1/2007 | | |
| JP | 2009231497 A | 10/2009 | | |
| JP | 2011520249 A | 7/2011 | | |
| TW | 201332173 A | 8/2013 | | |
| WO | WO 97/15954 A1 | 5/1997 | | |
| WO | WO-9715954 A1 * | 5/1997 | ......... | G11C 11/5678 |
| WO | WO 2009/126891 A1 | 10/2009 | | |
| WO | WO-2009126891 A1 * | 10/2009 | ......... | H01L 27/2481 |

OTHER PUBLICATIONS

Simka et al, "Fundamentals of CU/Barrier-Layer Adhesion in Microelectronic Processing", Materials Research Society Proceedings, Mar. 2005, vol. 863, pp. 283-288, XP009187264.

KIPO; First Office Action issued in KR Patent Application No. 10-2017-7004790, dated Nov. 16, 2020; 8 pages including English translation.

International Preliminary Report on Patentability for International Application No. PCT/US2015/050030 dated Mar. 28, 2017 (11 pgs.).

International Search Report for International Application No. PCT/US2015/050030 dated Mar. 31, 2016 (5 pgs.).

Written Opinion of the International Searching Authority for International Application No. PCT/US2015/050030 dated Mar. 31, 2016 (10 pgs.).

KIPO; Second Office Action issued in KR Patent Application No. 10-2017-7004790, dated May 28, 2021; 6 pages including machine translation.

* cited by examiner

LAMINATE DIFFUSION BARRIERS AND RELATED DEVICES AND METHODS

BACKGROUND

Phase change materials are materials that can be repeatedly altered into distinct physical states that can be utilized for a desired task. More specifically, phase change memory is a type of non-volatile random-access memory that utilizes a detectable change in the physical state of the phase change material as an information storage medium. For example, the change in phase of a material from an amorphous state to a crystalline state or vice versa, can be induced and then detected in order to store and then retrieve information. As a simplified example, a chalcogenide material can be heated and cooled in a manner that solidifies the material in an amorphous state, or the chalcogenide can be heated and cooled in a manner that solidifies the material in a crystalline state. Other specific heating and cooling protocols may be employed to result in solidification of the chalcogenide material at different specific degrees of crystallinity across the spectrum between completely amorphous and completely crystalline states.

Once solidified, the phase change material is non-volatile. The phase change material state, whether solidified to a crystalline, semi-crystalline, amorphous, or semi-amorphous state, is thus retained until reprogrammed. This is due to the fact that, once solidified, the state of the material is not dependent upon electrical input.

DESCRIPTION OF EMBODIMENTS

Figure 1:
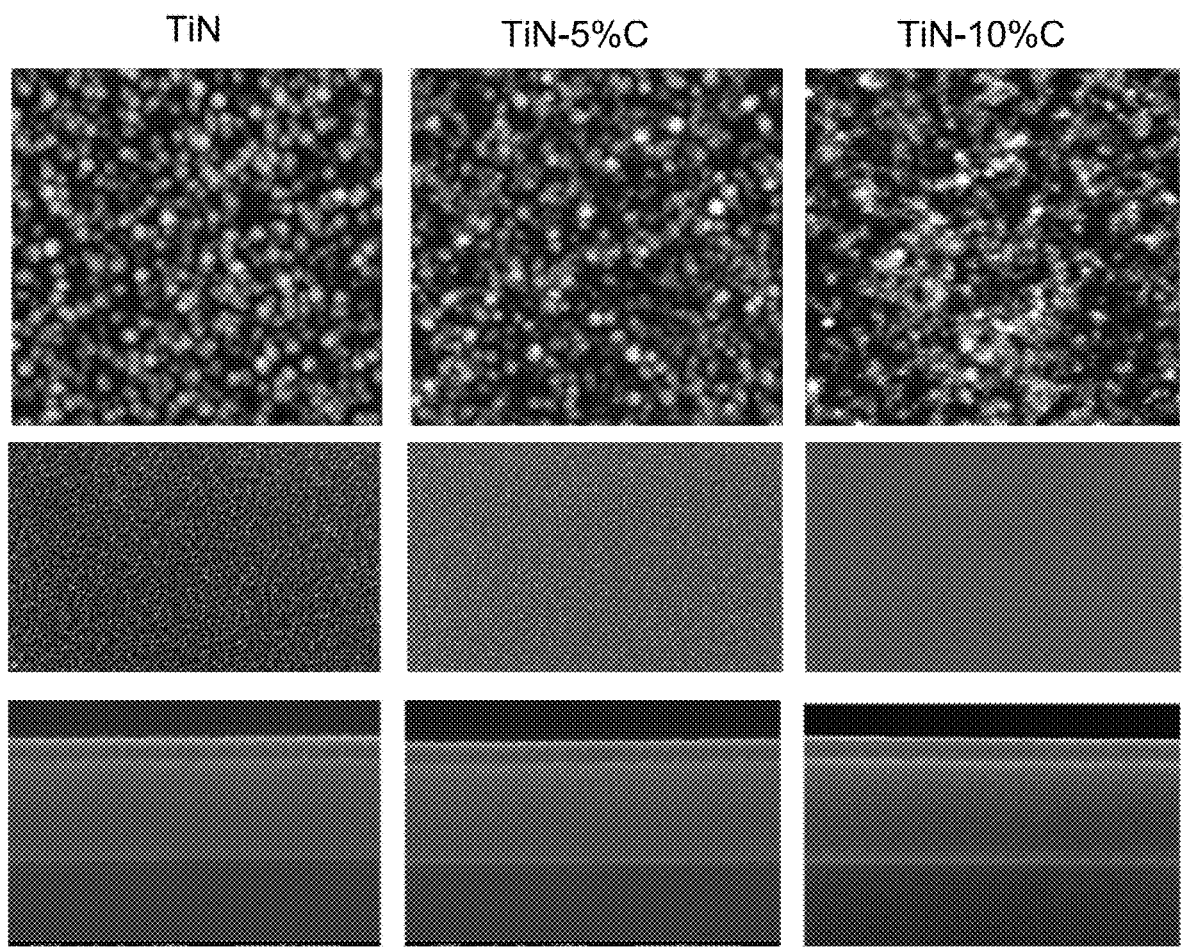
FIG. 1 is a series of images of TiN and C:TiN films in accordance with an invention embodiment.

Although the following detailed description contains many specifics for the purpose of illustration, a person of ordinary skill in the art will appreciate that many variations and alterations to the following details can be made and are considered to be included herein.

Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

As used in this specification and the appended claims, the singular forms "a," "an" and "the" include plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term, like "comprising" or "including," it is understood that direct support should be afforded also to "consisting essentially of" language as well as "consisting of" language as if stated explicitly and vice versa.

"The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The term "coupled," as used herein, is defined as directly or indirectly connected in an electrical or nonelectrical manner.

Objects or structures described herein as being "adjacent to" each other may be in physical contact with each other, in close proximity to each other, or in the same general region or area as each other, as appropriate for the context in which the phrase is used.

Occurrences of the phrase "in one embodiment," or "in one aspect," herein do not necessarily all refer to the same embodiment or aspect.

As used herein, "enhanced," "improved," "performance-enhanced," "upgraded," and the like, when used in connection with the description of a device or process, refers to a characteristic of the device or process that provides measurably better form or function as compared to previously known devices or processes. This applies both to the form and function of individual components in a device or process, as well as to such devices or processes as a whole.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

As used herein, numerical values as applied to the content of C, W, or N in an electrode, including numerical values relative to one another, such as ratios, can be considered to be measured in atomic % (i.e. at %).

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Example Embodiments

An initial overview of technology embodiments is provided below and specific technology embodiments are then described in further detail. This initial summary is intended to aid readers in understanding the technology more quickly but is not intended to identify key or essential technological features, nor is it intended to limit the scope of the claimed subject matter.

Various materials having phase change properties can be utilized in a variety of systems and devices. Such materials are capable of being repeatedly altered into detectably distinct and stable structural states, and can thus be used in numerous applications from switching to nonvolatile memory storage. Chalcogenide (sometimes referred to as chalcogide) materials, for example, can be repeatedly altered from an amorphous to a crystalline state based on the manner in which the material was heated and/or cooled to the solidified state. Thus, a programming current can be used to fix the chalcogenide material into a desired state. This nonvolatile state of the material is thus maintained until a subsequent programming current alters the structure of the chalcogenide. Additionally, in some cases chalcogenide materials can also be solidified into multiple states along the range from amorphous to crystalline, and thus are not necessarily limited to binary applications.

In some non-limiting designs, a layer of chalcogenide material can be disposed between two or more electrodes that can provide the current to alter the structural state of the material, as well as electrical access used in device functionality. Such electrical access can include current through a switching element, detection of the state of the chalcogenide in memory applications, state detection for other binary or non-binary applications, and the like. One potential problem that can arise, however, is the diffusion of chalcogenide materials through various electrode materials such as, for example, carbon. Diffusion can occur during the manufacturing process, as well as during heating and/or cooling of the device during use. Such diffusion can cause detrimental effects on performance at the chalcogenide/electrode interface, undesirable interactions of the diffused chalcogenide with device layers beyond the electrode, as well as a reduction in performance of a given device as a whole.

As such, the performance and reliability of a device can be enhanced or improved by limiting, preventing, or substantially preventing diffusion of the chalcogenide into the electrode material. This can be accomplished using a novel diffusion barrier between the chalcogenide and the electrode materials. Such barriers can include materials that provide at least sufficient electrical conductivity for device functionality, while at the same time limiting chalcogenide diffusion. In one example, a carbon and titanium nitride (C:TiN) material can be utilized as laminate barrier between the chalcogenide and an electrode to limit, prevent, or substantially prevent the diffusion of the chalcogenide through to the electrode.

While TiN lacking a carbon component can be employed as a diffusion barrier, and in some aspects is considered to be within the present scope, TiN tends to have a columnar structure with a diameter that can allow significant diffusion into and/or therethrough. When TiN is formed by, for example, co-sputtering with carbon, the mean diameter of the C:TiN columns is reduced. This reduction in columnar grain size and population of the boundaries with carbon results in increased electrical resistance and improved barrier properties, particularly to the confinement of chalcogenide diffusion. The increased electrical resistance is generally not problematic, as traditional carbon electrodes have high electrical resistances. In one aspect, for example, the present C:TiN materials can have an electrical resistance of from about 0.5 to about 100 mOhm-cm for a thickness of from about 10 to about 70 A. In another aspect, C:TiN materials can have an electrical resistance of from about 3 to about 100 mOhm-cm for a thickness of from about 10 to about 70 A. In yet another aspect, C:TiN materials can have an electrical resistance of from about 3 to about 10 mOhm-cm for a thickness of from about 15 to about 50 A.

As one non-limiting example, a TiN material having a columnar grain size of about 10 nm can allow diffusion of a mobile chalcogenide along the column boundaries and/or pores. By co-sputtering the TiN material with about 1 at % to about 40 at % of carbon, the column size is reduced along with the pore size, thus limiting the diffusion pathways therethrough. In some embodiments, the amount of carbon can be from about 5 at % to about 20 at %. In some aspects columns can be reduced from about 5% to about 25% in mean diameter size as compared to a column of TiN only. In other aspects, column size can be reduced from about 5% to about 10% in mean diameter size as compared to a column of TiN only. In yet other aspects, the C:TiN material can have a column grain size that is at least about 5% smaller compared to un-doped TiN material. In some embodiments, the columnar gran size (i.e. diameter) reduction can be continuous and can be from about 10 nm to about 2 nm. In other embodiments the reduction can be from about 8 nm to about 4 nm.

Additionally, in some aspects the inclusion of carbon causes the TiN material to become more amorphously arranged which can further limit the diffusion of chalcogenide through the barrier. FIG. 1 shows a series of AFM and X-SEM images of TiN (left column) and carbon-doped TiN (middle and right columns) films showing reductions in TiN columnar grain diameter with the introduction of carbon. Additionally, the inclusion of carbon in the TiN material reduces the roughness of the material. As one example, TiN doped to about 10 at % carbon can have an RMS roughness of less than about 5 A. In another example, TiN doped to about 10 at % carbon can have an RMS roughness of less than about 3 A. In some embodiments, the roughness can be from about 3 A to about 11 A. In an additional embodiment, the roughness can be from about 1 A to about 8 A.

Furthermore, it is additionally beneficial that the columnar grain size can be tuned by adjusting the deposition conditions to achieve a C:TiN material having given desirable properties to be suitable to various device designs. Such controllable properties can include, without limitation, compressive stress, electrical resistivity, barrier strength, and the like. In one embodiment, depositions conditions can include a pressure of from about 0.5 mT to about 10 mT. In another embodiment, the pressure can be from about 1 mT to about 5 mT. In yet another embodiment, the pressure can be from about 4 mT to about 8 mT. In addition, the sputtering mode used can be any one of DC, PDC, or RF.

C:TiN can be formed using a variety of processes, and any such process is considered to be within the present scope. Non-limiting examples can include a variety of physical vapor deposition (PVD) and chemical vapor deposition (CVD) processes, as well as application techniques involving thermal spraying, reactive growth, and the like. Specific techniques can include cathodic arc deposition, electron beam deposition, sputtering deposition, laser deposition, and the like. In some aspects TiN and carbon can be deposited in tandem such as, for example, by co-sputtering. In other aspect TiN and carbon can be deposited sequentially, by either the same or distinct processes. One example can include the deposition of a TiN layer followed by carbon implantation by any capable process, such as ion implantation for example.

In one specific aspect, C:TiN materials can be formed by a PVD co-sputtering process. Various co-sputtering techniques and chamber designs are contemplated, and as such, the following should not be seen as limiting. As a general description of various PVD system details, one design can utilize a PVD chamber that is maintained under vacuum. In some cases the PVD chamber can include two primary parts: a pedestal used to hold a substrate in position, and a source or target made from the material to be sputtered onto the substrate. The target can be made of a single element, or an alloy or mixture of elements. Titanium and carbon can be sputtered from one or more targets in an atmosphere containing nitrogen to form the desired C:TiN material. Thus, the sputtering targets can be separate titanium and carbon targets, one or more composite titanium/carbon targets, or any other target material configuration. An electrical power generator is generally connected between target (cathode, negative polarity) and ground. Furthermore, a gas such as argon (Ar) is mixed with the nitrogen in the deposition chamber, although any gas capable of facilitating a plasma process can be utilized. The carbon composition of the resulting material can be varied by varying the power to the carbon cathode. Non-limiting exemplary working pressures for C:TiN materials can be from about $1 \times 10^{-4}$ Torr to about $3 \times 10^{-3}$ Torr.

Regarding the general operation of a typical PVD process, the chamber is filled with Ar, often kept at a low pressure (e.g. 0.1-100 mTorr). Upon activation of the power generator, some of the Ar atoms inside the chamber are ionized (Ar→Ar+/e−) and form a plasma. The Ar+ ions, (cations) are attracted by the target, which is negatively charged, and thus move toward and impact the target surface. If the transferred energy is sufficiently high, the ionized Ar+ breaks the target material into atoms/clusters and sputters them onto the substrate surface. Depending on the properties of materials to be sputtered, the power source may be DC (direct/continuous current), DC-pulsed (a DC current with a periodic polarity inversion, for example), or RF (radio-frequency). A DC source applies a constant power to the target, and is often used sputter metals and good conductive alloys onto the substrate. A DC-pulsed source it is often used for elements/compounds that are not good electrical conductors (e.g. carbon, chalcogenide alloys). The polarity inversion of the voltage applied by generator can be used to clear the target surface of residual electrical charges. RF sources apply a sinusoidal voltage with the typical RF frequency (e.g. 13.56 MHz). The sinusoidal fluctuation is also used to clear the target surface of residual charges. RF power sources are often used to sputter insulating materials on a substrate (e.g. oxides).

Carbon content in the C:TiN barrier material can vary depending on the desired properties of the resulting material. In one aspect, for example, the carbon concentration in the C:TiN material is from about 1 to about 30 at %. In another aspect, the carbon concentration in the C:TiN material is from about 3 to about 20 at %. In yet another aspect, carbon concentration in the C:TiN material is from about 5 to about 15 at %. In yet another aspect, the carbon concentration in the C:TiN material is about 10 at %. In a further aspect, the carbon concentration can be about 30 at % or less. In an additional aspect, the carbon concentration can be about 40 at % or less.

Given the diversity of manufacturing techniques, the physical structure of the C:TiN material can vary. It is noted that any form of C:TiN that can be used to form an effective barrier to diffusion between a chalcogenide material and an electrode or other adjacent structure is considered to be within the present scope. In some aspects, for example, the carbon and TiN materials can be a homogenous or substantially homogenous mixture. In other aspects, the carbon and TiN materials can be distinct layers or regions of carbon and TiN. For example, TiN and carbon can be formed as a layered structure provided that such layering provides the desired barrier properties against diffusion. Superlattice structures are additionally contemplated, such as, for example, alternating layers of TiN and carbon. In some aspects C:TiN materials can also include structures where carbon is formed at discrete regions within the TiN layer, with the TiN material being substantially free of carbon. One example can include a TiN layer having carbon impregnated into the columnar pores or spaces, and the TiN is substantially free of carbon. Other aspects include C:TiN material structures that are intermediates between a homogenous mixture and discrete regions of carbon and TiN. For example, a C:TiN material can include concentrated regions of carbon in the columnar pores or spaces, while the TiN material itself is doped or mixed with carbon.

C:TiN barrier materials can be formed across entire regions of a substrate, or across only a portion thereof. Furthermore, C:TiN can be deposited to any thickness desired to suit a particular application. In many cases, however, barrier layers used between a chalcogenide and an electrode can be thick enough to provide a diffusion barrier, but thin enough to avoid negative performance effects on the device. In one aspect, for example, the C:TiN material can have a thickness of from about 10 A to about 70 A. In another aspect, the C:TiN material can have a thickness of from about 15 A to about 50 A. In yet another aspect, the C:TiN material can have a thickness of from about 10 A to about 100 A.

Figure 2:
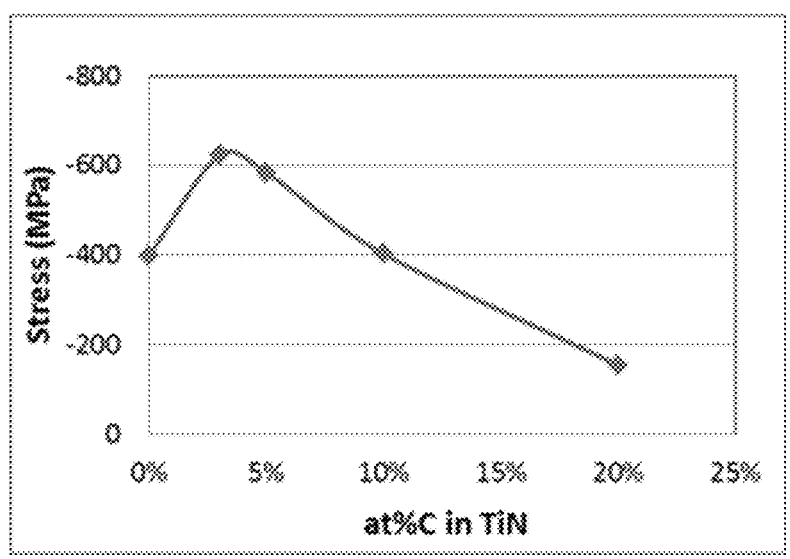
FIG. 2 is a graphical representation of data in accordance with an invention embodiment.
Figure 3:
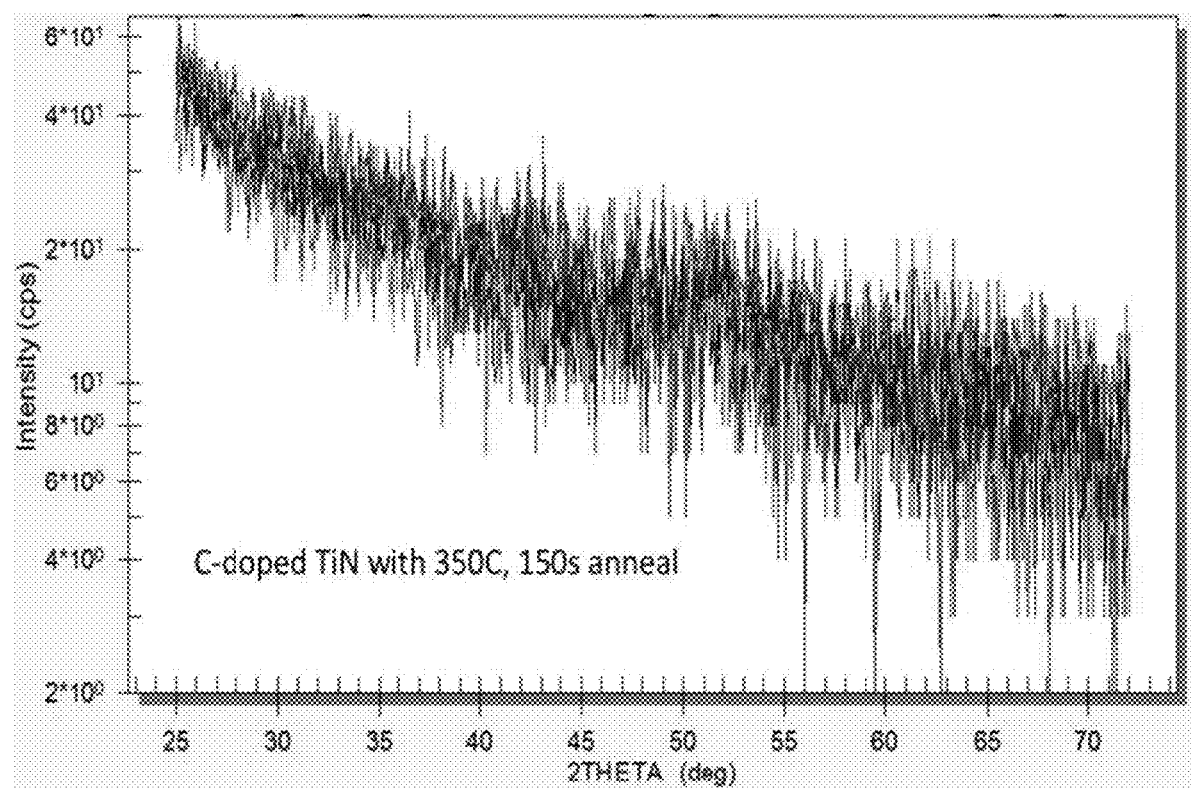
FIG. 3 is a graphical representation of data in accordance with an invention embodiment.

Furthermore, as is shown in FIG. 2, C:TiN materials beneficially exhibit stress under compressive testing of less than about 650 MPa. The various materials shown in FIG. 2 have a carbon content of from about 3 to about 20 at %. These results demonstrate that such stress can be modulated through controlling the carbon doping of the TiN material, thus underscoring one structural benefit of such a material. Additionally, rapid thermal processing (RTP) treatment of C:TiN materials, in this case at 350° C. for 150 seconds, showed no TiN crystallization as can be seen in FIG. 3. FIG. 3 shows testing of 6 different lots of C:TiN materials having carbon contents of 3 at %, 5 at %, and 10 at % where no cubic TiN peaks are observed. This cycling endurance can greatly enhance the longevity and performance of devices incorporating chalcogenide materials due to the effective C:TiN barriers against diffusion.

C:TiN barrier materials can be utilized in a number of configurations, and with a wide variety of systems and devices. As such, any device, system, or method incorporating such barrier materials is considered to be within the present scope. As such, the following provides various examples of implementations of C:TiN barrier materials, and as such, are not intended to be limiting.

In one aspect, for example, a diffusion barrier system for limiting diffusion of a phase change material is provided. Such a barrier system can include an electrode, a phase change material electrically coupled to the electrode, and a C:TiN diffusion barrier disposed between the electrode and the phase change material, where the diffusion barrier limits diffusion of the phase change material to the electrode.

In another aspect, a switching device, such as an ovonic threshold switching (OTS) device is provided. An ovonic threshold switch can include any type or design of switch that includes at least two electrical contacts separated by a phase change material. In one example, such a switch is in either an "on" state or an "off" state depending on the level of voltage potential applied across the electrical contacts. Thus, when the voltage potential exceeds a given threshold, the phase change material will alter to the on or conductive state. It is noted that the off state can be a non-conducting state, a substantially non-conductive state, or a state that is sufficient to be considered non-conductive from the perspective of device functionality. Ovonic threshold switches can be used in a variety of non-limiting device and/or system designs, all of which are considered to be within the present scope. Examples can include circuit elements, interconnections between circuits, logic processing, selection switches for phase change memory as well as non-memory applications, filtering, current suppression, and the like.

Figure 4:
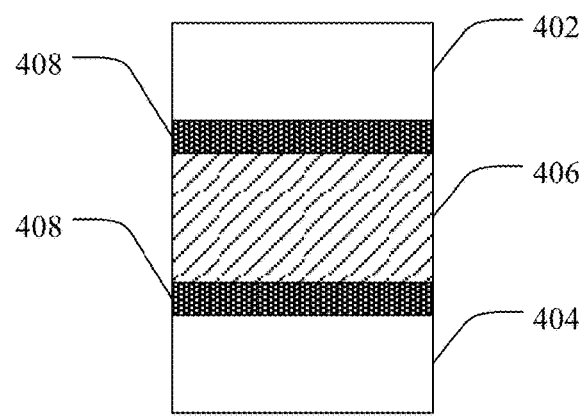
FIG. 4 is a schematic view of a phase change material device in accordance with an invention embodiment.

As is shown in FIG. 4, such a device can include a first electrode 402, a second electrode 404, a phase change material 406 disposed between the first electrode 402 and the second electrode 404, and a C:TiN diffusion barrier material 408 disposed between the phase change material 406 and at least one of the first or second electrodes. In some aspects, the C:TiN material 408 can be disposed between the phase change material 406 and both the first electrode 402 and second electrode 404, as is specifically shown in FIG. 4. Accordingly, the C:TiN material 408 provides a barrier against the diffusion of the phase change material 406 into either of the first electrode 402 or the second electrode 404.

Figure 5A:
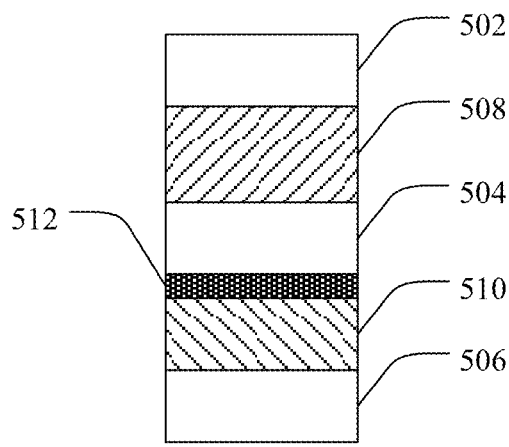
FIG. 5A is a schematic view of a phase change memory device in accordance with an invention embodiment.
Figure 5B:
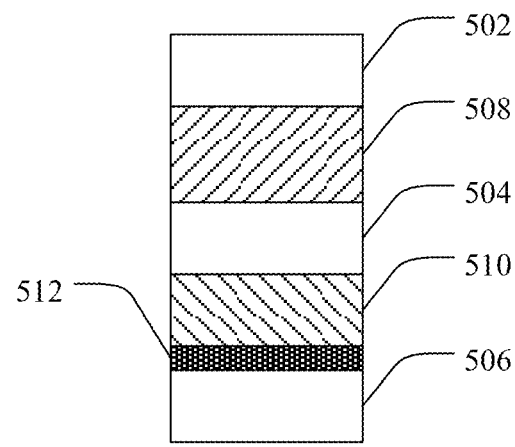
FIG. 5B is a schematic view of a phase change memory device in accordance with an invention embodiment.

As another example, the present C:TiN barrier materials can be utilized in phase change memory cells, devices, systems, and the like. In one aspect, a phase change memory cell device is provided. Such a device can include a stacked structure as is shown in FIGS. 5A-B. Such a stacked structure can include at least three electrodes, a first electrode 502, a second electrode 504, and a third electrode 506. A phase change material 508 is disposed between the first electrode 502 and the second electrode 504, and a select device material 510 is disposed between the third electrode 506 and the second electrode 504. A C:TiN diffusion barrier material 512 is disposed in between one or more of the aforementioned structures. FIG. 5A, for example, shows a C:TiN material 512 between the second electrode 504 and the select device material 510, while FIG. 5B shows a C:TiN material 512 between the third electrode 506 and the select device material 510. It should be understood that the arrangements in FIGS. 5A and 5B, along with the remaining figures, are merely exemplary, and that C:TiN materials can be disposed at any location to limit diffusion of a material, including the phase change material and the select device material. In one aspect, however, the C:TiN material is disposed between the second electrode and the select device material only. In another aspect, the C:TiN material is disposed between the third electrode and the select device material only. In yet another aspect, the C:TiN material is disposed between the second electrode and the select device material and between the third electrode and the select device material only. In a further aspect, the C:TiN material is disposed between the first electrode and the phase change material and between the second electrode and the phase change material only. In yet another aspect, the C:TiN material is disposed between the first electrode and the phase change material, between the second electrode and the phase change material, between the second electrode and the select device material, and between the third electrode and the select device material.

Figure 6A:
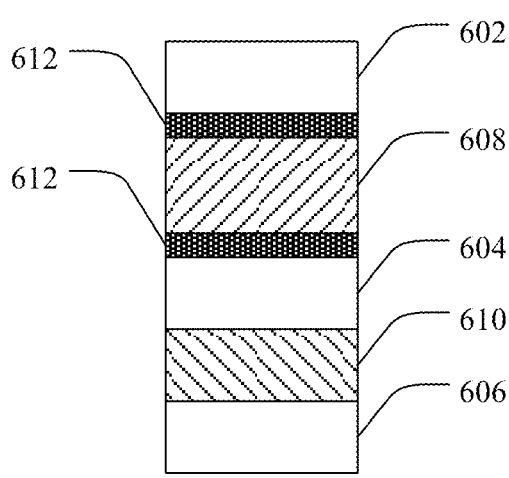
FIG. 6A is a schematic view of a phase change memory device in accordance with an invention embodiment.
Figure 6B:
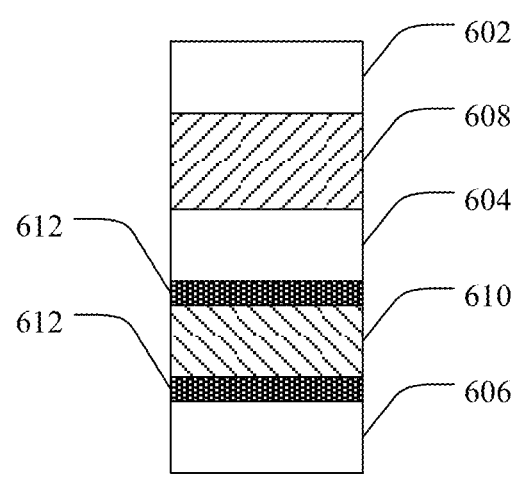
FIG. 6B is a schematic view of a phase change memory device in accordance with an invention embodiment.

FIGS. 6A-B show examples of memory cells having C:TiN materials positioned around each region containing a phase change material. Specifically, both FIGS. 6A-B generally show memory stack structures having at least three electrodes, a first electrode 602, a second electrode 604, and a third electrode 606, a phase change material 608 disposed between the first electrode 602 and the second electrode 604, and a select device material 610 disposed between the third electrode 606 and the second electrode 604. FIG. 6A shows C:TiN material 612 disposed between the phase change material 608 and both of the first electrode 602 on one side and the second electrode 604 on the other side. FIG. 6B shows C:TiN material 612 disposed between the select device material 610 and both of the second electrode 604 on one side and the third electrode 606 on the other side.

Figure 7:
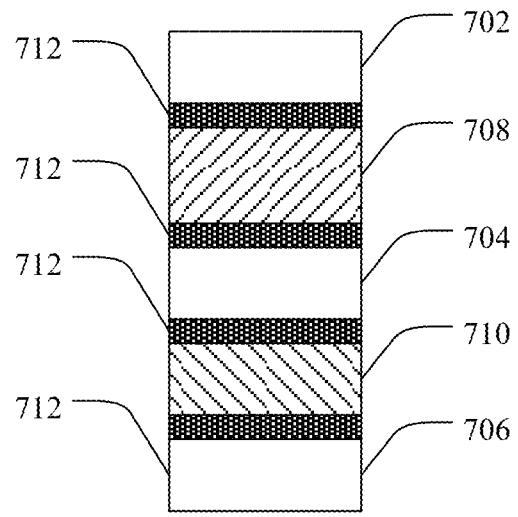
FIG. 7 is a schematic view of a phase change memory device in accordance with an invention embodiment.

As yet another example, FIG. 7 shows a memory stack structure having at least three electrodes, a first electrode 702, a second electrode 704, and a third electrode 706, a phase change material 708 disposed between the first electrode 702 and the second electrode 704, and a select device material 710 disposed between the third electrode 706 and the second electrode 704. C:TiN material 712 is disposed between each of these layers to limit the diffusion of phase change material from either of the phase change material 708 or the select device material 710 through any adjacent layer.

As a general matter, the phase change material can include any useful material having a stable and detectable change in phase. Examples of such a materials include any of a variety of chalcogenide alloys, including, without limitation, Ge—Te, In—Se, Sb—Te, Ge—Sb, Ga—Sb, In—Sb, As—Te, Al—Te, Ge—Sb—Te, Te—Ge—As, In—Sb—Te, In—Se—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among others. The hyphenated chemical composition notation, as used herein, indicates the elements included in a particular mixture or compound, e.g., chalcogenide alloy, and is intended to represent all stoichiometries involving the indicated elements, e.g., $Ge_XSb_YTe_Z$ having variations in stoichiometries, such as $Ge_2Sb_2Te_5$, $Ge_2Sb_2Te_7$, $Ge_1Sb_2Te_4$, $Ge_1Sb_4Te_7$, etc., to form a gradient.

It is noted that the select device material is generally made of a phase change material, and as such, the above exemplary chalcogenide materials are applicable as well. The actual chalcogenide material used in a given memory cell for the phase change material layer and the select device material layer can be different or the same, depending on the design of the device.

Figure 8:
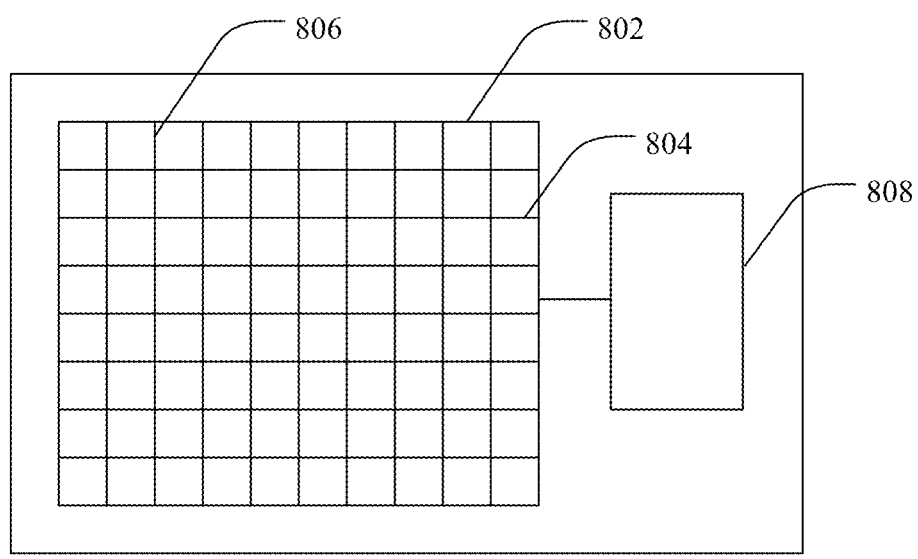
FIG. 8 is a schematic view of a phase change memory system in accordance with an invention embodiment.

In another aspect, a phase change memory system is provided, as is shown in FIG. 8. Such a system can include an array of phase change memory cells 802 arranged in rows and columns. A plurality of word lines 804 and a plurality of bit lines 806 intersecting the plurality of word lines 804 can be electrically coupled to the array of phase change memory cells 802 to provide addressing. A read/write controller 808 can be electrically coupled to the plurality of word lines 804 and the plurality of bit lines 806 to perform, among other things, read and write operations to and from the array of phase change memory cells 802 via the plurality of word lines 804 and the plurality of bit lines 806. Switches such as ovonic switches as well as capacitors, junctions, or other features or structures (not shown) can be incorporated into the design of the array of memory cells and/or the overall system. Operation of the memory array or system proceeds according to standard operation for such a phase change memory device, by application of current through column and row lines, etc.

Furthermore, in some aspects the phase change memory system can include multiple arrays of phase change memory cells. These multiple arrays can be arranged in a variety of configurations, including stacked arrangements, side-by-side arrangements, and the like, including combinations thereof.

In yet another aspect, a method of forming a diffusion inhibited phase change structure is provided. Such a method can include forming a first electrode, forming a second electrode, and forming a phase change material that is disposed between the first electrode and the second electrode. The method can further include forming a TiN layer between at least one of the first electrode and the phase change material or the second electrode and the phase change material, and doping the TiN layer with carbon to form a C:TiN layer. In one aspect, the C:TiN layer can be disposed between the first electrode and the phase change material and between the second electrode and the phase change material. Furthermore, the present method can be repeated for a select device material with associated electrodes for use in forming phase change memory cells or devices.

In one aspect, doping of the carbon can be accomplished by co-sputtering titanium and carbon in a nitrogen environment, as has been described. It is noted, however, that any technique useful for the formation of C:TiN is considered to be within the present scope.

Examples

The following examples pertain to further embodiments.

In one embodiment, there is provided an ovonic threshold switching (OTS) device, comprising:
a first electrode;
a second electrode;
a phase change material disposed between the first electrode and the second electrode; and
a carbon and TiN (C:TiN) diffusion barrier material disposed between the phase change material and at least one of the first or second electrodes.

In one embodiment, the C:TiN material is disposed between the phase change material and both the first and second electrodes.

In one embodiment, the C:TiN material has a thickness of from about 10 A to about 70 A.

In one embodiment, the C:TiN material has a thickness of from about 15 A to about 50 A.

In one embodiment of the switching device, the C:TiN material has an amorphous structure.

In one embodiment of the switching device, the carbon concentration of the C:TiN material is from about 3 to about 20 at %.

In one embodiment of the switching device, the carbon concentration of the C:TiN material is from about 5 to about 15 at %.

In one embodiment of the switching device, the carbon concentration of the C:TiN material is about 10 at %.

In one embodiment of the switching device, the C:TiN material has an RMS roughness of less than about 5 A.

In one embodiment of the switching device, the C:TiN material has an RMS roughness of less than about 3 A.

In one embodiment of the switching device, the C:TiN material has a column grain size that is at least about 5% smaller compared to un-doped TiN material.

In one embodiment of the switching device, the C:TiN material has an electrical resistance of from about 3 to about 100 mOhm-cm for a thickness of from about 10 to about 70 A.

In one embodiment of the switching device, the C:TiN material has an electrical resistance of from about 3 to about 10 mOhm-cm for a thickness of from about 15 to about 50 A.

In one embodiment, there is provided a diffusion barrier for limiting diffusion of a phase change material, comprising:
  an electrode;
  a phase change material electrically coupled to the electrode;
  a carbon and TiN (C:TiN) diffusion barrier disposed between the electrode and the phase change material, wherein the diffusion barrier limits diffusion of the phase change material to the electrode.

In one embodiment, the phase change material is chalcogenide.

In one embodiment, there is provided a phase change memory cell device, comprising:
  a stacked structure include;
  a first electrode;
  a second electrode;
  a third electrode;
  a phase change material disposed between the first electrode and the second electrode;
  a select device material disposed between the third electrode and the second electrode; and
  a carbon and TiN (C:TiN) diffusion barrier material disposed at a position selected from the group consisting of between the first electrode and the phase change material, between the second electrode and the phase change material, between the second electrode and the select device material, between the third electrode and the select device material, and a combination thereof.

In one embodiment of a phase change memory cell device, the C:TiN material is disposed between the second electrode and the select device material only.

In one embodiment of a phase change memory cell device, the C:TiN material is disposed between the third electrode and the select device material only.

In one embodiment of a phase change memory cell device, the C:TiN material is disposed between the second electrode and the select device material and between the third electrode and the select device material only.

In one embodiment of a phase change memory cell device, the C:TiN material is disposed between the first electrode and the phase change material and between the second electrode and the phase change material only.

In one embodiment of a phase change memory cell device, the C:TiN material is disposed between the first electrode and the phase change material, between the second electrode and the phase change material, between the second electrode and the select device material, and between the third electrode and the select device material.

In one embodiment of a phase change memory cell device, the C:TiN material has a thickness of from about 10 A to about 70 A.

In one embodiment of the phase change memory cell device, the C:TiN material has a thickness of from about 15 A to about 50 A.

In one embodiment of a phase change memory cell device, the C:TiN material has an amorphous structure.

In one embodiment of a phase change memory cell device, the carbon concentration of the C:TiN material is from about 3 to about 20 at %.

In one embodiment of a phase change memory cell device, the carbon concentration of the C:TiN material is from about 5 to about 15 at %.

In one embodiment of a phase change memory cell device, the carbon concentration of the C:TiN material is about 10 at %.

In one embodiment of a phase change memory cell device, the C:TiN material has an RMS roughness of less than about 3 A.

In one embodiment of a phase change memory cell device, the C:TiN material has a column grain size that is at least about 5% smaller compared to un-doped TiN material.

In one embodiment of a phase change memory cell device, the C:TiN material has an electrical resistance of from about 0.5 to about 15 mOhm-cm for a thickness of from about 10 to about 70 A.

In one embodiment of a phase change memory cell device, the C:TiN material of has an electrical resistance of from about 3 to about 10 mOhm-cm for a thickness of from about 15 to about 50 A.

In one embodiment of a phase change memory cell device, the C:TiN material has an RMS roughness of less than about 3 A.

In one embodiment, there is provided a phase change memory system, comprising:
  an array of phase change memory cells as recited herein arranged in rows and columns;
  a plurality of word lines electrically coupled to the array of phase change memory cells;
  a plurality of bit lines electrically coupled to the array of phase change memory cells and intersecting the plurality of word lines.
  a read/write controller electrically coupled to the plurality of word lines and the plurality of bit lines, the read/write controller being operable to perform read and write operations to and from the array of phase change memory cells via the plurality of word lines and the plurality of bit lines.

In one embodiment, the system further comprises multiple arrays of phase change memory cells in a stacked configuration.

In one embodiment, there is provided a method of forming a diffusion inhibited phase change structure, comprising:
  forming a first electrode;
  forming a second electrode;
  forming a phase change material disposed between the first electrode and the second electrode;
  forming a TiN layer between at least one of the first electrode and the phase change material or the second electrode and the phase change material; and
  doping the TiN layer with carbon to form a C:TiN layer.

In one embodiment of such method, the C:TiN layer is disposed between the first electrode and the phase change material and between the second electrode and the phase change material.

In one embodiment of such method, the C:TiN material is formed to a thickness of from about 10 A to about 70 A.

In one embodiment of such method, the C:TiN material is formed to a thickness of from about 15 A to about 50 A.

While the forgoing examples are illustrative of the principles of various invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. An ovonic threshold switching (OTS) device, comprising:
    a first electrode;
    a second electrode;
    a phase change material disposed between the first electrode and the second electrode; and
    a carbon and TiN (C:TiN) diffusion barrier material disposed between and adjacent to the phase change material and the first electrode and between and adjacent to the phase change material and the second electrode, wherein the C:TiN diffusion barrier material is electrically conductive and wherein the C:TiN diffusion barrier material is to limit diffusion of the phase change material, wherein the C:TiN diffusion barrier material comprises TiN doped with carbon, the C:TiN diffusion barrier material having distinct regions of carbon and TiN including one of distinct layers of carbon and TiN, superlattice structures including alternating layers of carbon and TiN, or a material having a TiN material substantially free of carbon and further defining columnar pores or spaces therein with carbon impregnated in the columnar pores or spaces, wherein the C:TiN diffusion barrier material that is between and adjacent to the phase change material and either of the first electrode or the second electrode has a thickness of from about 10 A to about 70 A and has an electrical resistance of from about 3 to about 100 mOhm-cm, and wherein the first and second electrodes are carbon electrodes.

2. The OTS device of claim 1, wherein the carbon concentration of the C:TiN diffusion barrier material is from about 10 to about 20 at %.

3. The OTS device of claim 1, wherein the C:TiN diffusion barrier material has a column grain size that is at least about 5% smaller compared to un-doped TiN material.

4. The OTS device of claim 1, wherein the C:TiN diffusion barrier material has an RMS roughness of less than about 5 A.

5. A phase change memory cell device, comprising:
    a stacked structure including:
        a first electrode;
        a second electrode;
        a third electrode;
        a phase change material disposed between the first electrode and the second electrode;
        a select device material disposed between the third electrode and the second electrode; and
        a carbon and TiN (C:TiN) diffusion barrier material disposed at a position selected from the group consisting of:
        between and adjacent to each of the first electrode, the second electrode, and the phase change material;
        between and adjacent to each of the second electrode, the third electrode, and the select device material; and
        between and adjacent to each of the first electrode, the second electrode, the third electrode, the phase change material and the select device material, wherein the C:TiN diffusion barrier material comprises distinct regions of carbon and TiN including one of distinct layers of carbon and TiN, superlattice structures including alternating layers of carbon and TiN, or a material having a TiN material substantially free of carbon and further defining columnar pores or spaces therein with carbon impregnated in the columnar pores or spaces, wherein the C:TiN diffusion barrier that is between and adjacent to the phase change material and either of the first electrode or the second electrode material has a thickness of from about 10 A to about 70 A and has an electrical resistance of from about 3 to about 100 mOhm-cm, and wherein the first and second electrodes are carbon electrodes.

6. The device of claim 5, wherein the C:TiN diffusion barrier material is disposed between the second electrode and the select device material and between the third electrode and the select device material only.

7. The device of claim 5, wherein the C:TiN diffusion barrier material is disposed between the first electrode and the phase change material and between the second electrode and the phase change material only.

8. The device of claim 5, wherein the C:TiN diffusion barrier material is disposed between the first electrode and the phase change material, between the second electrode and the phase change material, between the second electrode and the select device material, and between the third electrode and the select device material.

9. The device of claim 5, wherein the carbon concentration of the C:TiN diffusion barrier material is from about 3 to about 20 at %.

10. The device of claim 5, wherein the C:TiN diffusion barrier material has a column grain size that is at least about 5% smaller compared to un-doped TiN material.

11. The device of claim 5, wherein the C:TiN diffusion barrier material has an RMS roughness of less than about 3 A.

* * * * *